United States Patent
Chiu et al.

(10) Patent No.: US 11,699,423 B1
(45) Date of Patent: Jul. 11, 2023

(54) APPARATUS FOR NOISE REDUCTION IN AUDIO SIGNAL PROCESSING

(71) Applicant: ELITE SEMICONDUCTOR MICROELECTRONICS TECHNOLOGY INC., Hsinchu (TW)

(72) Inventors: Hsin-Yuan Chiu, Hsinchu (TW); Hsiang-Yu Yang, Hsinchu (TW); Ya-Mien Hsu, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 46 days.

(21) Appl. No.: 17/583,235

(22) Filed: Jan. 25, 2022

(51) Int. Cl.
*G10K 11/178* (2006.01)
*H03G 3/00* (2006.01)

(52) U.S. Cl.
CPC ....... *G10K 11/17813* (2018.01); *H03G 3/001* (2013.01)

(58) Field of Classification Search
CPC  H03G 1/00; H03G 3/00; H03G 3/001; G10K 11/17813
See application file for complete search history.

(56) References Cited

U.S. PATENT DOCUMENTS

| | | | |
|---|---|---|---|
| 8,717,211 B2 | 5/2014 | Miao et al. | |
| 9,813,814 B1 * | 11/2017 | Satoskar | H04R 3/04 |
| 2011/0068867 A1 * | 3/2011 | Moses | H03G 3/001 |
| | | | 330/131 |
| 2011/0150237 A1 * | 6/2011 | Nagasue | H03F 3/45475 |
| | | | 381/94.1 |
| 2011/0176693 A1 * | 7/2011 | O'Connell | H03G 3/001 |
| | | | 381/120 |
| 2012/0133411 A1 * | 5/2012 | Miao | H03G 3/3089 |
| | | | 327/306 |
| 2017/0094408 A1 * | 3/2017 | Napoli | H03G 3/20 |
| 2018/0098149 A1 * | 4/2018 | Das | H03F 3/45596 |

FOREIGN PATENT DOCUMENTS

| | | | | |
|---|---|---|---|---|
| CN | 102355214 A | | 2/2012 | |
| CN | 105282655 A | * | 1/2016 | ............. H03G 3/001 |
| CN | 107005209 A | * | 8/2017 | ............... H03G 3/00 |
| CN | 107078707 A | * | 8/2017 | ............. H03G 3/001 |
| WO | WO-2011085741 A1 | * | 7/2011 | ............. H03G 3/001 |
| WO | WO-2018133565 A1 | * | 7/2018 | ............... H03G 3/20 |

* cited by examiner

*Primary Examiner* — David L Ton

(57) ABSTRACT

An apparatus for noise reduction in audio signal processing includes a power amplifier, a zero-crossing detector, and a threshold detector. The power amplifier has an input signal terminal for receiving an audio input signal and an output signal terminal. The audio input signal is a digital-to-analog converted version according to a version of a digital audio signal. The power amplifier has an analog gain which is controllable in response to an analog gain control signal. The zero-crossing detector determines a zero-crossing detection signal according to an internal signal provided between the input signal terminal and the output signal terminal. The threshold detector determines a gain setting according to the digital audio signal and the zero-crossing detection signal to generate the analog gain control signal indicating the gain setting, wherein the threshold detector controls the analog gain of the power amplifier according to the analog gain control signal.

12 Claims, 7 Drawing Sheets

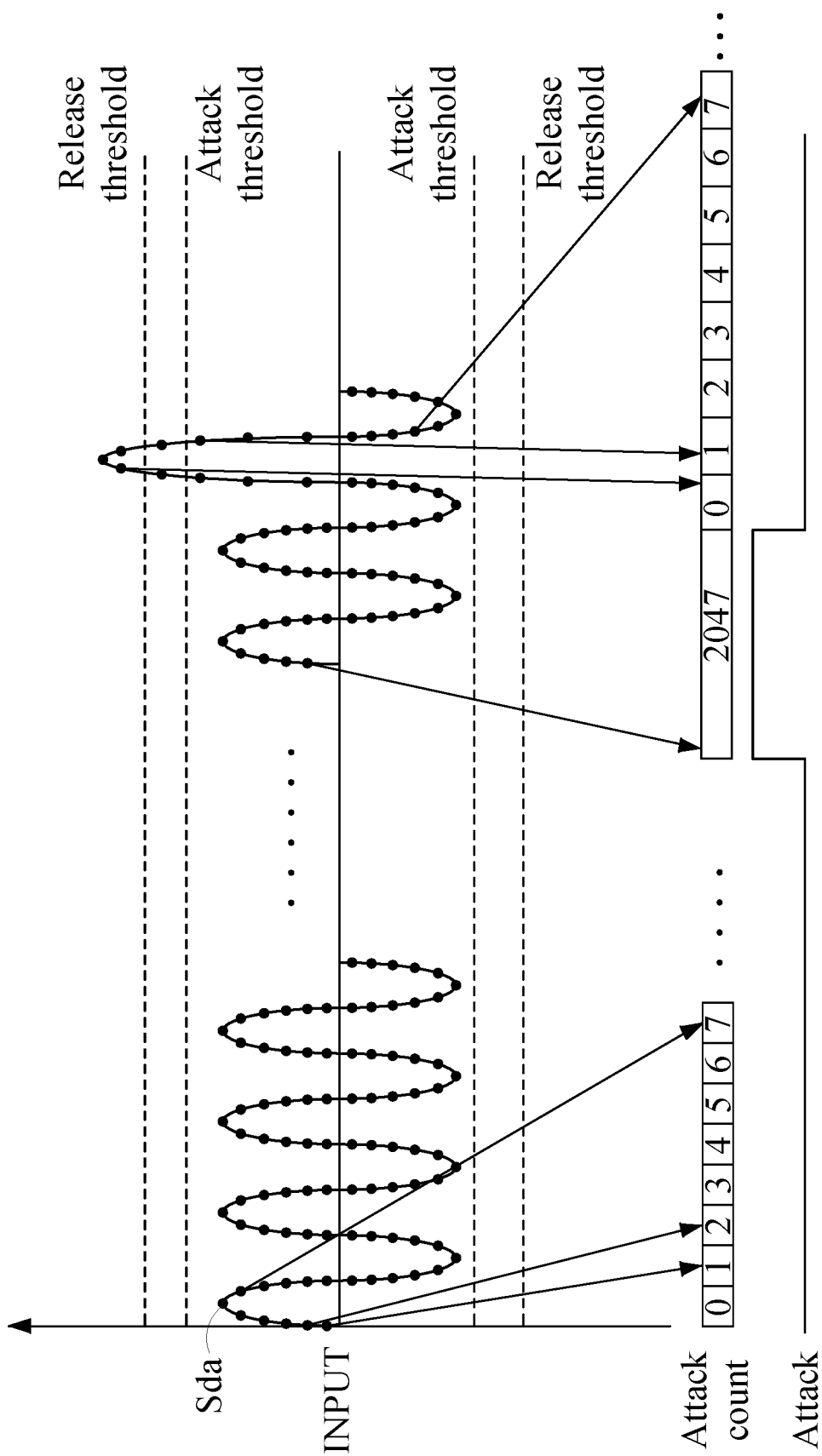

APPARATUS FOR NOISE REDUCTION IN AUDIO SIGNAL PROCESSING

BACKGROUND OF THE INVENTION

1. Field of the Invention

The present disclosure relates to an integrated circuit, and in particular to an apparatus for noise reduction in audio signal processing.

2. Description of the Related Art

Current electronic systems typically include a digital processing module, a data converter, and an analog processing module. In an audio signal processing system, such as an audio reproduction device, an audio signal, before conversion to an analog signal, is digitally processed. The digital processing module may include a digital signal processor to receive a digital audio signal and apply various types of digital processing, such as filtering, frequency upsampling, and/or other digital signal processing. The output of the digital processing module may be coupled to a digital-to-analog converter to convert the processed digital signal to an analog signal. The analog processing module may further include processing circuits such as a power amplifier to drive a subsequent stage.

In the signal path, the power amplifier may be a variable gain amplifier to provide the signal with sufficient gain for the subsequent stage so as to achieve a wide dynamic range. However, noise may still be introduced in the signal path and be amplified undesirably by the power amplifier.

BRIEF SUMMARY OF THE INVENTION

An objective of the present disclosure is to provide an apparatus for noise reduction in audio signal processing with analog gain control.

To achieve at least the above objective, the present disclosure provides an apparatus for noise reduction in audio signal processing. The apparatus comprises: a power amplifier, a zero-crossing detector, and a threshold detector. The power amplifier has an input signal terminal and an output signal terminal, wherein an audio input signal is applied to the input signal terminal, and the audio input signal is a digital-to-analog converted version according to a version of a digital audio signal, the power amplifier has an analog gain which is controllable in response to an analog gain control signal. The zero-crossing detector is used for determining a zero-crossing detection signal according to an internal signal provided between the input signal terminal and the output signal terminal. The threshold detector is used for determining a gain setting according to the digital audio signal and the zero-crossing detection signal to generate the analog gain control signal indicating the gain setting, wherein the threshold detector controls the analog gain of the power amplifier according to the analog gain control signal.

In some embodiments, the threshold detector determines the gain setting as a first gain parameter when the threshold detector detects that the digital audio signal varies within a first reference range and the zero-crossing detection signal indicates a zero-crossing state; otherwise, the threshold detector determines the gain setting as a second gain parameter.

In some embodiments, the power amplifier has a plurality of gain setting states and the power amplifier is set to one of the gain setting states according to the gain setting indicated in the analog gain control signal, wherein the first gain parameter indicates one of the gain setting states such that the power amplifier has a lower gain.

In some embodiments, the internal signal includes an analog signal varying according to a signal at the input signal terminal and a signal at the output signal terminal.

In some embodiments, the zero-crossing detector includes a comparator circuit to generate the zero-crossing detection signal according to a comparison between the analog signal and a reference signal.

In some embodiments, the internal signal includes a first signal and a second signal both varying according to a signal at the input signal terminal and a signal at the output signal terminal, and the first signal and the second signal are analog differential signals.

In some embodiments, the zero-crossing detector includes: a first comparator circuit and a second comparator circuit. The first comparator circuit generates a first comparison result signal according to a comparison between the first signal and a reference signal. The second comparator circuit generates a second comparison result signal according to a comparison between the second signal and the reference signal. The zero-crossing detector generates the zero-crossing detection signal according to the first comparison result signal and the second comparison result signal.

In some embodiments, the internal signal includes a first signal and a second signal both varying according to a signal at the input signal terminal and a signal at the output signal terminal, and the first signal and the second signal are pulse-width modulation signals.

In some embodiments, the zero-crossing detector includes: a first comparator circuit, a second comparator circuit, and a zero-crossing determination circuit. The first comparator circuit generates a first comparison result signal according to a comparison between the first signal and a reference signal. The second comparator circuit generates a second comparison result signal according to a comparison between the second signal and the reference signal. The zero-crossing determination circuit generates the zero-crossing detection signal according to a comparison between the first comparison result signal and the second comparison result signal. When one of the first signal and the second signal indicates a high state, the zero-crossing determination circuit starts comparing the first signal and the second signal whether the first signal and the second signal are equal. When the first signal and the second signal are equal and have a same interval for indicating the high state after the first signal and the second signal turn to a low state, the zero-crossing determination circuit generates the zero-crossing detection signal to indicate a zero-crossing state; otherwise, the zero-crossing determination circuit generates the zero-crossing detection signal to indicate a non-zero-crossing state.

In some embodiments, the power amplifier is based on a class D amplifier.

In some embodiments, the apparatus further comprises a digital-to-analog converter for performing digital-to-analog conversion according to the version of the digital audio signal to generate the audio input signal.

As such, the embodiments of the apparatus for noise reduction in audio signal processing are provided. The apparatus can be utilized to control the analog gain so that the noise level can be reduced when some situations such as a lower signal (e.g., nearly zero or small) output occur. Because the apparatus controls the power amplifier when at least two conditions including a zero-crossing state and a small signal state are detected, the analog gain control is more accurate and timely performed. Thus, the average noise level of the output of the power amplifier can be reduced.

BRIEF DESCRIPTION OF THE DRAWINGS

FIG. 6 is a schematic diagram illustrating an embodiment of threshold detection.

DETAILED DESCRIPTION OF THE INVENTION

To facilitate understanding of the object, characteristics and effects of this present disclosure, embodiments together with the attached drawings for the detailed description of the present disclosure are provided.

Figure 1:
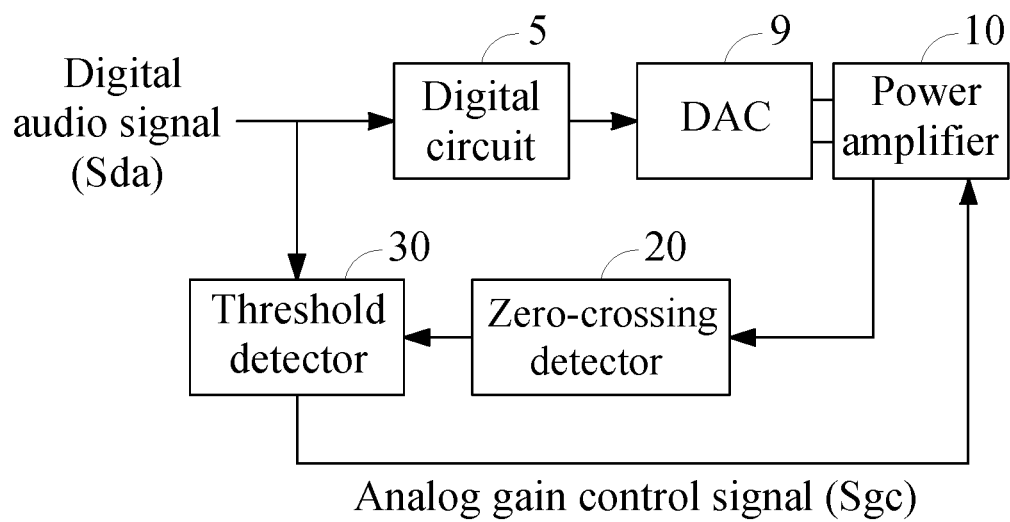
FIG. 1 is a schematic diagram illustrating exemplary architecture of an apparatus for noise reduction in audio signal processing, representative of various embodiments of the present disclosure.

Referring to FIG. 1, exemplary architecture of an apparatus for noise reduction in audio signal processing is illustrated, representative of various embodiments of the present disclosure. As shown in FIG. 1, an apparatus for noise reduction in audio signal processing includes a power amplifier 10, a zero-crossing detector 20, and a threshold detector 30. The apparatus can be applied to an audio signal processing path such as the path including a digital circuit 5, a digital-to-analog converter (DAC) 9, and the power amplifier 10, wherein a digital audio signal (Sda) is applied to the audio signal processing path, and the output of the power amplifier 10 can then be applied for reproduction such as by a speaker, headphone, earphone and so on. In addition, the digital circuit 5 is optional to perform digital signal processing such as filtering, frequency upsampling, equalization, audio effects, or any appropriate audio processing. In some embodiments, the apparatus can be further implemented as a digital input audio amplifier or audio reproduction device.

The power amplifier 10 has at least one input signal terminal and at least one output signal terminal. An audio input signal is applied to the input signal terminal. As illustrated in FIG. 1, the audio input signal is a digital-to-analog converted version according to a version of a digital audio signal (Sda) by the digital-to-analog converter 9, for example. The power amplifier 10 has an analog gain which is controllable in response to an analog gain control signal (Sgc).

The zero-crossing detector 20 determines a zero-crossing detection signal according to an internal signal provided between the input signal terminal and the output signal terminal.

The threshold detector 30 is used for determining a gain setting according to the digital audio signal and the zero-crossing detection signal to generate the analog gain control signal indicating the gain setting, wherein the threshold detector 30 controls the analog gain of the power amplifier 10 according to the analog gain control signal.

In some embodiments, the threshold detector 30 determines the gain setting as a first gain parameter when the threshold detector 30 detects that the digital audio signal varies within a first reference range (e.g., a range of 0.01%, 0.1%, 1%, 2% of a maximal allowable signal magnitude (or digital value)) and the zero-crossing detection signal indicates a zero-crossing state; otherwise, the threshold detector 30 determines the gain setting as a second gain parameter.

In some embodiments, the power amplifier 10 has a plurality of gain setting states (e.g., gains of 3.52 dB (1.5 times), 6 dB (2 times), 8 dB (2.5 times), 9.5 dB (3 times), 11.5 dB (3.75 times), 13 dB (4.5 times), 14 dB (5 times), and 15.5 dB (6 times)) and the power amplifier 10 is set to one of the gain setting states according to the gain setting indicated in the analog gain control signal, wherein the first gain parameter indicates one of the gain setting states such that the power amplifier 10 has a lower gain (e.g., 3.52 dB (1.5 times)).

In an example that it is supposed that the power amplifier 10 has a characteristic that a lowest noise level is achieved when the lowest gain setting is set (e.g., 3.52 dB (1.5 times)), when the signal output of the power amplifier 10 is nearly zero or is approaching zero, a user of the power amplifier 10 is very sensitive to any noise. In this situation, the apparatus of the embodiments can control the power amplifier 10 to set to its lowest gain setting state to reduce noise when the signal output of the power amplifier 10 is nearly zero or is approaching zero. In this way, the average noise level is reduced by way of the apparatus.

In some embodiments, the apparatus can further include the digital-to-analog converter 9 for performing digital-to-analog conversion according to the version of the digital audio signal to generate the audio input signal.

Figure 2:
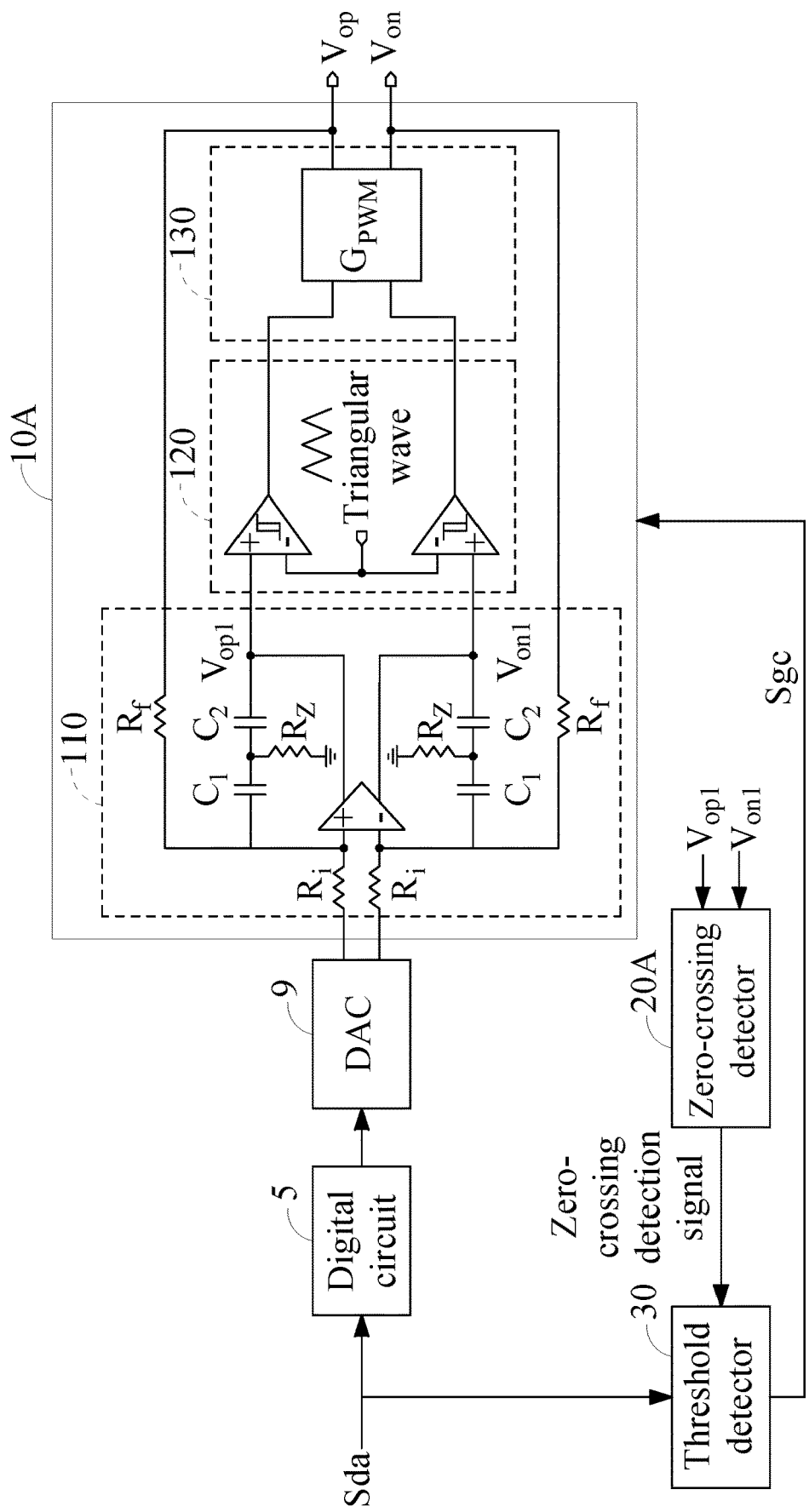
FIG. 2 is a block diagram of an embodiment of an apparatus for noise reduction in audio signal processing for use in the exemplary architecture of FIG. 1.

Referring to FIG. 2, an apparatus for noise reduction in audio signal processing for use in the exemplary architecture of FIG. 1 is illustrated. As shown in FIG. 2, an apparatus for noise reduction in audio signal processing includes a power amplifier 10A, a zero-crossing detector 20A, and a threshold detector 30. In FIG. 2, the power amplifier 10A is based on a class D amplifier and includes an error amplifier stage 110, a comparator stage 120, and an output stage 130.

For example, the error amplifier stage 110, for example, receives an audio input signal from the digital-to-analog converter 9 and outputs signals $V_{op1}$ and $V_{on1}$ to the comparator stage 120. The error amplifier stage 110 includes an amplifier, resistors $R_i$, $R_z$, and capacitors $C_1$, $C_2$. The comparator stage 120 includes comparators to compare the signals $V_{op1}$ and $V_{on1}$ with a triangular wave and outputs signals (such as pulse-width modulated signals) to the output stage 130. The output stage 130, which is an output stage circuit having a gain represented by $G_{PWM}$, generates output signals $V_{op}$ and $V_{on}$, which can be applied for reproduction such as by a speaker or headphone. In addition, the output signals $V_{op}$ and $V_{on}$ are fed back to the error amplifier stage 110 through resistors $R_f$. In some embodiments, the power amplifier 10A can be implemented as a digitally controlled variable gain amplifier and for example, one or more components, such as one or more resistors (e.g., $R_i$, $R_f$ or other), can be implemented as digitally controlled variable components for gain control. Certainly, the implementation of the invention is not limited to the examples of the power amplifier 10A. In some embodiments, any other power amplifier that is based on a class D amplifier and/or can provide one or more internal signals between an input signal terminal and an output signal terminal of the power amplifier for use in zero-crossing detection can be utilized to implement the apparatus for noise reduction in audio signal processing.

Figure 3A:
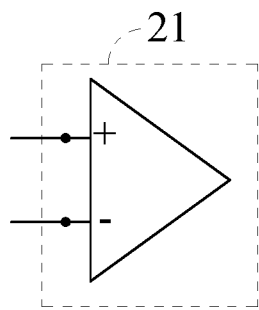
FIG. 3A is a block diagram illustrating an embodiment of a zero-crossing detector.

In some embodiments, the internal signal includes an analog signal varying according to a signal at the input signal terminal and a signal at the output signal terminal. For example, a signal from the error amplifier stage 110, such as $V_{op1}$ or $V_{on1}$, as shown in FIG. 2, can be served as the analog signal. In some embodiments, as illustrated in FIG. 3A, the zero-crossing detector 20A can include a comparator circuit 21 to generate the zero-crossing detection signal according to a comparison between the analog signal and a reference signal (e.g., a range of 0.01%, 0.1%, 1%, 2% of a maximal allowable signal magnitude (or digital value)).

Figure 3B:
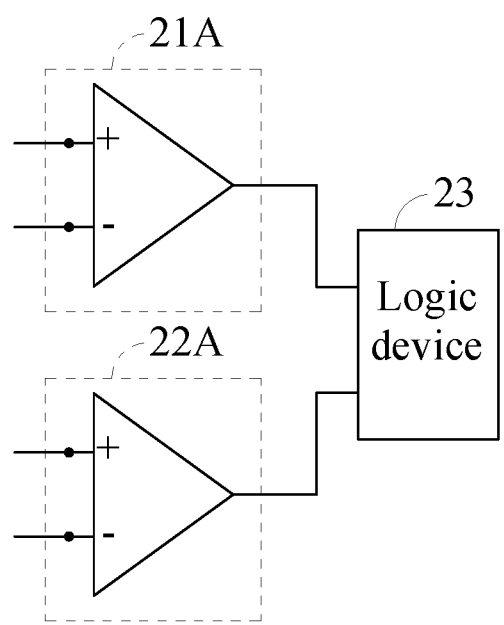
FIG. 3B is a block diagram illustrating an embodiment of a zero-crossing detector.

In some embodiments, the internal signal includes a first signal and a second signal (e.g., $V_{op1}$ or $V_{on1}$, as shown in FIG. 2) both varying according to a signal at the input signal terminal and a signal at the output signal terminal, and the first signal and the second signal are analog differential signals. In some embodiments, as shown in FIG. 3B, the zero-crossing detector 20A includes: a first comparator circuit 21A and a second comparator circuit 22A. The first comparator circuit 21A generates a first comparison result signal according to a comparison between the first signal and a reference signal. The second comparator circuit 22A generates a second comparison result signal according to a comparison between the second signal and the reference signal. The zero-crossing detector 20 generates the zero-crossing detection signal according to the first comparison result signal and the second comparison result signal, for example, by way of a logic device 23.

Figure 4:
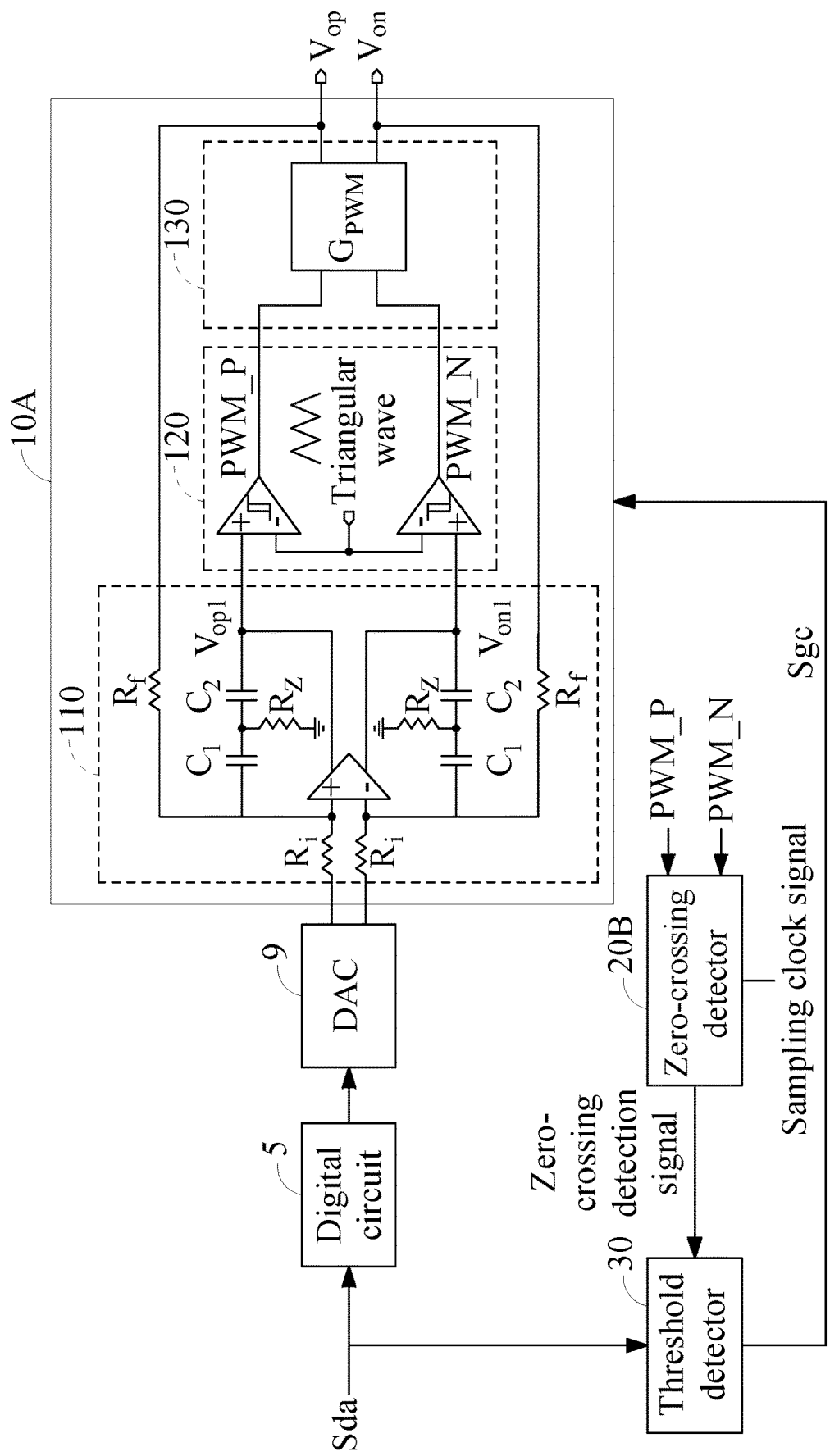
FIG. 4 is a block diagram illustrating another embodiment of an apparatus for noise reduction in audio signal processing for use in the exemplary architecture of FIG. 1.

Referring to FIG. 4, another embodiment of an apparatus for noise reduction in audio signal processing for use in the exemplary architecture of FIG. 1 is illustrated. As shown in FIG. 4, an apparatus for noise reduction in audio signal processing includes a power amplifier 10A, a zero-crossing detector 20B, and a threshold detector 30.

In some embodiments, the internal signal includes a first signal and a second signal both varying according to a signal at the input signal terminal and a signal at the output signal terminal, and the first signal and the second signal are pulse-width modulation signals. For example, signals from the comparator stage 120, such as pulse-width modulated signals PWM_P, PWM_N, as shown in FIG. 4, can be served as the first signal and the second signal.

Figure 5A:
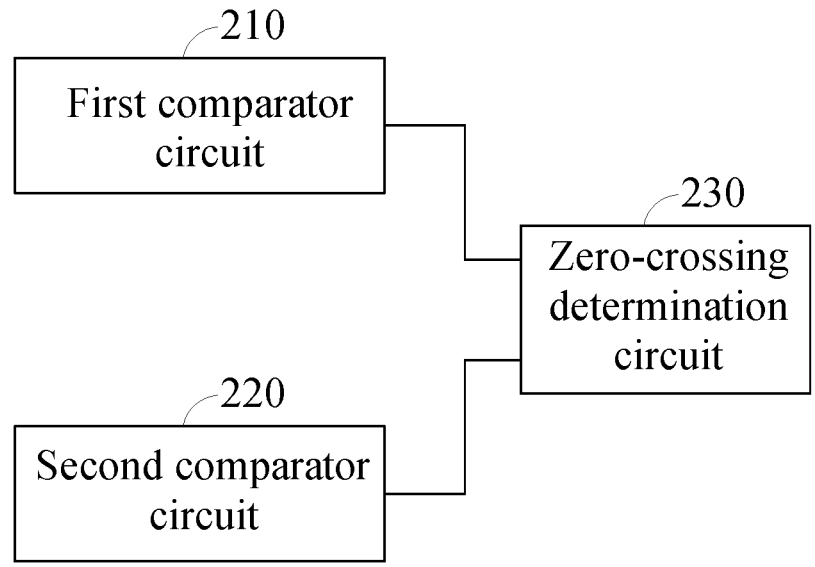
FIG. 5A is a block diagram illustrating an embodiment of a zero-crossing detector.

In some embodiments, as shown in FIG. 5A, the zero-crossing detector 20B includes: a first comparator circuit 210, a second comparator circuit 220, and a zero-crossing determination circuit 230.

The first comparator circuit 210 generates a first comparison result signal according to a comparison between the first signal and a reference signal. The second comparator circuit 220 generates a second comparison result signal according to a comparison between the second signal and the reference signal. The zero-crossing determination circuit 230 generates the zero-crossing detection signal according to a comparison between the first comparison result signal and the second comparison result signal.

Figure 5B:
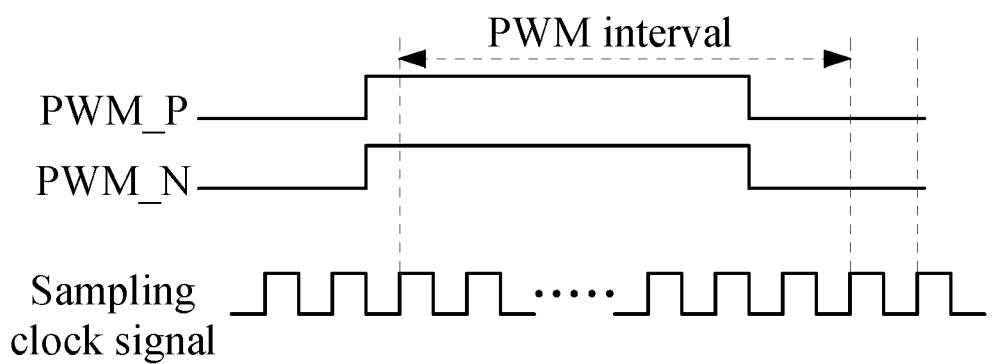
FIG. 5B is a schematic diagram illustrating an embodiment of zero-crossing detection.

Referring to FIGS. 5A and 5B, when one of the first signal and the second signal (e.g., pulse-width modulated signals PWM_P, PWM_N) indicates a high state, the zero-crossing determination circuit 230 starts comparing the first signal and the second signal whether the first signal and the second signal are equal. For example, a sampling clock signal can be utilized to sample or count the pulse-width modulated signals PWM_P, PWM_N for comparison or detection, wherein the sampling clock signal has a sampling frequency (e.g., 25 MHz) greater than an operating frequency (e.g., 384 kHz) of the pulse-width modulated signals PWM_P, PWM_N.

Referring to FIGS. 5A and 5B, when the first signal and the second signal are equal and have a same interval (e.g., PWM interval) for indicating the high state after the first signal and the second signal turn to a low state (e.g., turning to the low state for two or more clock cycles), the zero-crossing determination circuit 230 generates the zero-crossing detection signal to indicate a zero-crossing state; otherwise, the zero-crossing determination circuit 230 generates the zero-crossing detection signal to indicate a non-zero-crossing state.

Refer to FIG. 6, which is a schematic diagram illustrating an embodiment of threshold detection. The threshold detector 30 can be configured to determine the gain setting as a first gain parameter, as described in the above embodiments with reference to FIG. 1, when the threshold detector 30 detects that the digital audio signal varies within a first reference range (e.g., a range of 0.01%, 0.1%, 1%, 2% of a maximal allowable signal magnitude (or digital value)), as illustrated by an attack threshold shown in FIG. 6, and the zero-crossing detection signal indicates a zero-crossing state; otherwise, the threshold detector 30 determines the gain setting as a second gain parameter.

Figure 7:
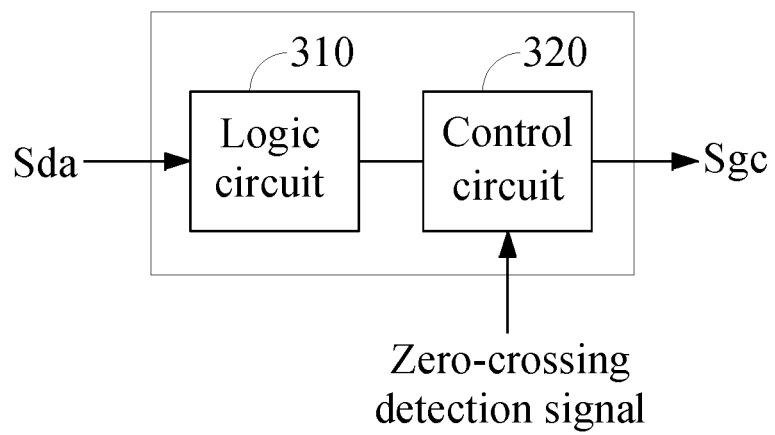
FIG. 7 is a block diagram illustrating an embodiment of a threshold detector.

For example, referring to FIG. 6, the threshold detector 30 can be configured to include a logic circuit (e.g., 310 as shown in FIG. 7) for determining whether the digital audio signal (Sda) is within the first reference range (e.g., attack threshold) by way of comparison and counting. If the digital audio signal (Sda) is within the first reference range (e.g., the digital audio signal (Sda) in magnitude (or its absolute value) is equal to or less than an attack threshold), an attack counting begins from zero until a counting threshold (e.g., 2047 or any appropriate number) is reached. If the counting threshold is reached, an attack signal may be generated; for example, the attack signal is asserted as a pulse as shown in FIG. 6. In addition, if the digital audio signal (Sda) is out of the first reference range and is within a second reference range (e.g., the digital audio signal (Sda) in magnitude (or its absolute value) is equal to or greater than a release threshold), the attack counting is reset to zero. Otherwise, if the digital audio signal (Sda) is between the first reference range and the second reference range (e.g., the digital audio signal (Sda) in magnitude (or its absolute value) is greater than the attack threshold or less than the release threshold), the attack counting remains unchanged.

In an embodiment, the threshold detector 30, for example, can be configured to include a control circuit (e.g., 320 in FIG. 7) for determining the analog gain control signal (Sgc) according to the attack signal obtained as exemplified above and the zero-crossing detection signal. For example, the analog gain control signal (Sgc) can represent a value B[2:0] as illustrated in TABLE 1 to control the power amplifier 10A operating at a gain setting state.

TABLE 1 illustrates a number of gain setting states that the power amplifier 10A supports for example, wherein the analog gain of the power amplifier 10A is determined according to resistors $R_f$ and $R_i$. In some embodiments, the power amplifier 10A can be implemented by a digitally controlled variable gain amplifier, wherein the analog gain control signal (Sgc) indicates the value B[2:0]. In other embodiments, the power amplifier 10A can be implemented by an analog (e.g., voltage) controlled variable gain amplifier, wherein the analog gain control signal indicates a voltage signal corresponding to a gain setting.

TABLE 1

| BIT | VALUE | FUNCTION (analog gain control) | $R_f$ | $R_i$ |
|---|---|---|---|---|
| B[2:0] | 000 | X6(+15.5 dB) | 480K | 60K |
| | 001 | X5(14 dB) | 480K | 96K |
| | 010 | X4.5(13 dB) | 480K | 106.6K |
| | 011 | X3.75(11.5 dB) | 480K | 128K |
| | 100 | X3(9.5 dB) | 480K | 160K |
| | 101 | X2.5(8 dB) | 480K | 192K |
| | 110 | X2(6 dB) | 480K | 240K |
| | 111 | X1.5(3.5 dB) | 480K | 320K |

For example, in order to minimize the noise level, the threshold detector 30 determines the gain setting as a first gain parameter (e.g., B[2:0]=111) when the threshold detector 30 detects that the digital audio signal varies within a first reference range (e.g., a range of 0.01%, 0.1%, 1%, 2% of a maximal allowable signal magnitude (or digital value))(i.e., a small signal state) and the zero-crossing detection signal indicates a zero-crossing state.

In some examples, the threshold detector 30 can be configured optionally to determine the gain setting as another gain parameter (e.g., returning to a previous or another gain parameter other than the first gain parameter) when the situations of the small signal state and the zero-crossing state are not satisfied.

As such, the embodiments of the apparatus for noise reduction in audio signal processing are provided. The apparatus can be utilized to control the analog gain so that the noise level can be reduced when some situations such as a lower signal (e.g., nearly zero or small) output occur. Because the apparatus controls the power amplifier when at least two conditions including a zero-crossing state and a small signal state are detected, the analog gain control is more accurate and timely performed. Thus, the average noise level of the output and pop sound of the power amplifier can be reduced.

While the present disclosure has been described by way of specific embodiments, numerous modifications, combinations, and variations could be made thereto by those skilled in the art without departing from the scope and spirit of the present disclosure set forth in the claims.

What is claimed is:

1. An apparatus for noise reduction in audio signal processing, the apparatus comprising:
    a power amplifier having an input signal terminal and an output signal terminal, wherein an audio input signal is applied to the input signal terminal, and the audio input signal is a digital-to-analog converted version according to a version of a digital audio signal, the power amplifier has an analog gain which is controllable in response to an analog gain control signal;
    a zero-crossing detector for determining a zero-crossing detection signal according to an internal signal provided between the input signal terminal and the output signal terminal; and
    a threshold detector for determining a gain setting according to the digital audio signal and the zero-crossing detection signal to generate the analog gain control signal indicating the gain setting,
    wherein the threshold detector controls the analog gain of the power amplifier according to the analog gain control signal.

2. The apparatus according to claim 1, wherein the threshold detector determines the gain setting as a first gain parameter when the threshold detector detects that the digital audio signal varies within a first reference range and the zero-crossing detection signal indicates a zero-crossing state; otherwise, the threshold detector determines the gain setting as a second gain parameter.

3. The apparatus according to claim 2, wherein the power amplifier has a plurality of gain setting states and the power amplifier is set to one of the gain setting states according to the gain setting indicated in the analog gain control signal, wherein the first gain parameter indicates one of the gain setting states such that the power amplifier has a lower gain.

4. The apparatus according to claim 1, wherein the internal signal includes an analog signal varying according to a signal at the input signal terminal and a signal at the output signal terminal.

5. The apparatus according to claim 4, wherein the zero-crossing detector includes a comparator circuit to generate the zero-crossing detection signal according to a comparison between the analog signal and a reference signal.

6. The apparatus according to claim 1, wherein the internal signal includes a first signal and a second signal both varying according to a signal at the input signal terminal and a signal at the output signal terminal, and the first signal and the second signal are analog differential signals.

7. The apparatus according to claim 6, wherein the zero-crossing detector includes:
    a first comparator circuit to generate a first comparison result signal according to a comparison between the first signal and a reference signal; and
    a second comparator circuit to generate a second comparison result signal according to a comparison between the second signal and the reference signal,
    wherein the zero-crossing detector generates the zero-crossing detection signal according to the first comparison result signal and the second comparison result signal.

8. The apparatus according to claim 1, wherein the internal signal includes a first signal and a second signal both varying according to a signal at the input signal terminal and a signal at the output signal terminal, and the first signal and the second signal are pulse-width modulation signals.

9. The apparatus according to claim 8, wherein the zero-crossing detector includes:
    a first comparator circuit to generate a first comparison result signal according to a comparison between the first signal and a reference signal;
    a second comparator circuit to generate a second comparison result signal according to a comparison between the second signal and the reference signal; and
    a zero-crossing determination circuit to generate the zero-crossing detection signal according to a comparison between the first comparison result signal and the second comparison result signal,
    wherein when one of the first signal and the second signal indicates a high state, the zero-crossing determination circuit starts comparing the first signal and the second signal whether the first signal and the second signal are equal;

wherein when the first signal and the second signal are equal and have a same interval for indicating the high state after the first signal and the second signal turn to a low state, the zero-crossing determination circuit generates the zero-crossing detection signal to indicate a zero-crossing state; otherwise, the zero-crossing determination circuit generates the zero-crossing detection signal to indicate a non-zero-crossing state.

10. The apparatus according to claim 1, wherein the power amplifier is a class D amplifier.

11. The apparatus according to claim 1, wherein the apparatus further comprises a digital-to-analog converter for performing digital-to-analog conversion according to the version of the digital audio signal to generate the audio input signal.

12. The apparatus according to claim 1, wherein the apparatus is a digital input audio amplifier or an audio reproduction device.

\* \* \* \* \*